United States Patent
Cho et al.

(10) Patent No.: US 7,319,347 B2
(45) Date of Patent: Jan. 15, 2008

(54) BIDIRECTIONAL HIGH VOLTAGE SWITCHING DEVICE AND ENERGY RECOVERY CIRCUIT HAVING THE SAME

(75) Inventors: Yoon-Jay Cho, Seoul (KR); Il-Hun Son, Seoul (KR); Jae-Il Byeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 11/018,967

(22) Filed: Dec. 21, 2004

(65) Prior Publication Data

US 2005/0161733 A1    Jul. 28, 2005

(30) Foreign Application Priority Data

Jan. 26, 2004   (KR)   .................. 10-2004-0004703

(51) Int. Cl.
    *H03B 1/00*   (2006.01)
(52) U.S. Cl. ........................ 327/111; 327/112
(58) Field of Classification Search ........... 327/108, 327/112, 427, 111; 326/83, 87
    See application file for complete search history.

(56) References Cited

U.S. PATENT DOCUMENTS

| | | | | |
|---|---|---|---|---|
| 4,079,369 A * | 3/1978 | Fukumoto | ................... | 345/38 |
| 4,499,387 A * | 2/1985 | Konishi | ..................... | 326/87 |
| 5,204,558 A * | 4/1993 | Kumaki et al. | ............... | 326/87 |
| 5,563,526 A * | 10/1996 | Hastings et al. | .............. | 326/37 |
| 5,574,633 A * | 11/1996 | Prater | ......................... | 363/59 |
| 6,087,740 A | 7/2000 | Williams | .................... | 307/125 |
| 6,114,981 A * | 9/2000 | Nagata | ........................ | 341/143 |
| 6,777,745 B2* | 8/2004 | Hshieh et al. | .............. | 257/330 |
| 2002/0011556 A1* | 1/2002 | Feng | ....................... | 250/214 R |
| 2002/0047552 A1 | 4/2002 | Sano et al. | ............... | 315/169.2 |

FOREIGN PATENT DOCUMENTS

| | | |
|---|---|---|
| KR | 1998-23076 | 7/1998 |
| KR | 1020020059488 | 7/2002 |
| KR | 2002-89425 | 11/2002 |

\* cited by examiner

*Primary Examiner*—Jeffrey Zweizig
(74) *Attorney, Agent, or Firm*—F. Chau & Assoc., LLC

(57) ABSTRACT

Provided are a bi-directional high voltage switching device that includes an N-channel double diffused metal oxide semiconductor field effect transistor (DMOS FET) and a P-channel DMOS FET, each conducting current bi-directionally, and an energy recovery circuit that reduces the amount of energy consumed when charging or discharging a load capacitor by efficiently driving the bi-directional high voltage switching device; where the N-channel symmetric DMOS FET and the P-channel symmetric DMOS FET are connected to each other in parallel; and the energy recovery circuit includes a pull-up device, a pull-down device, an energy recovery capacitor, and a bi-directional high voltage switching device.

12 Claims, 8 Drawing Sheets

BIDIRECTIONAL HIGH VOLTAGE SWITCHING DEVICE AND ENERGY RECOVERY CIRCUIT HAVING THE SAME

CROSS-REFERENCE TO RELATED APPLICATION

This application claims foreign priority under 35 U.S.C. § 119 to Korean Patent Application No. 10-2004-0004703, filed on Jan. 26, 2004, in the Korean Intellectual Property Office, the disclosure of which is incorporated herein by reference in its entirety.

BACKGROUND OF THE INVENTION

1. Field of the Invention

The present disclosure relates to switching devices and energy recovery circuits having the same, and more particularly, to a bi-directional high voltage switching device and an energy recovery circuit that reduces the amount of energy consumed when charging or discharging a load capacitor by efficiently driving the bi-directional high voltage switching device.

2. Description of the Related Art

In order for an energy recovery circuit to make efficient use of energy when using a high voltage as a power supply voltage, the energy recovery circuit additionally includes an energy recovery capacitor that charges a load capacitor to a power supply voltage level or discharges the load capacitor to a ground voltage level. The amount of energy consumed when charging or discharging the load capacitor over several steps with the use of the energy recovery capacitor is smaller than the amount of energy consumed when performing the charge or discharge of the load capacitor in a single step. For example, in the case of charging the load capacitor to a desired voltage level in two steps by using the energy recovery capacitor, the load capacitor is charged with half of the voltage stored in the energy recovery capacitor in the first step, and then charged with the rest of the voltage stored in the energy recovery capacitor in the second step. Likewise, in the case of discharging the load capacitor in two steps by using the energy recovery capacitor, the load capacitor is discharged by half of the voltage in the first step, and then discharged by the other half of the voltage in the second step.

In order to realize the energy recovery circuit as a semiconductor device that uses a high voltage as a power supply voltage, a double diffused metal oxide semiconductor field effect transistor (DMOS FET) should be used as a bi-directional switching device for the energy recovery circuit. However, a conventional DMOS FET is inappropriate for being used as the bi-directional switching device for the energy recovery circuit because of the following reasons.

Figure 1A:
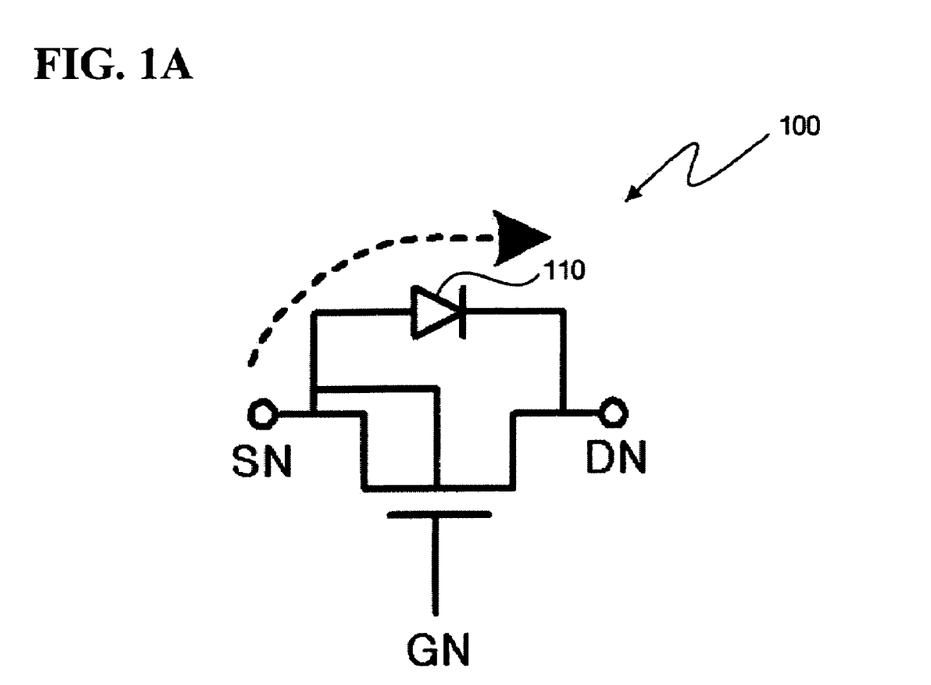
FIGS. 1A and 1B are equivalent circuit diagrams of a conventional N-channel diffused metal oxide semiconductor field effect transistor (DMOS FET) and a conventional P-channel DMOS FET, respectively.
Figure 1B:
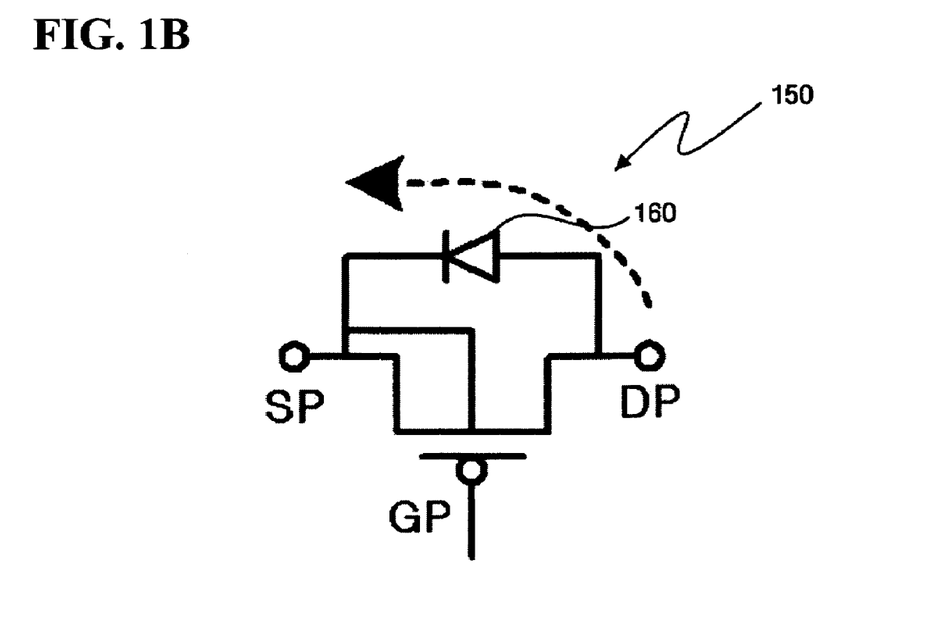

FIGS. 1A and 1B are equivalent circuit diagrams of a conventional N-channel DMOS FET 100 and a conventional P-channel DMOS FET 150, respectively. The conventional N-channel 100 and P-channel 150 DMOS FETs are connected to their respective semiconductor substrates at their respective sources SN and SP.

In the conventional N-channel DMOS FET 100, the source SN and a drain DN are not formed symmetrically to each other, and the source SN is connected to the semiconductor substrate on which the conventional N-channel DMOS FET is formed. Thus, when represented in equivalent circuit form, the conventional N-channel DMOS FET 100 includes a parasitic body diode 110 between the source SN and the drain DN, as shown in FIG. 1A.

When current flows from the drain DN to the source SN, a backward bias is applied to the parasitic body diode 110, and thus the parasitic body diode is turned off. Accordingly, it is possible to adjust the amount of current flowing between the drain DN and the source SN depending on the level of voltage applied to a gate GN of the FET. On the other hand, when current flows from the source SN to the drain DN, a forward bias is applied to the parasitic body diode 110, and thus the parasitic body diode is turned on. Accordingly, it is impossible to adjust the amount of current flowing between the drain DN and the source SN simply based on the level of voltage applied to the gate GN. Therefore, the conventional N-channel DMOS FET 100 is inappropriate for being used as a bi-directional switching device.

In the conventional P-channel DMOS FET 150, like in the conventional N-channel DMOS FET 100, the source SP and a drain DP are not formed symmetrically to each other, and the source SP is connected to the semiconductor substrate on which the conventional P-channel DMOS FET 150 is formed. Thus, when represented in equivalent circuit form, the conventional P-channel DMOS FET 150 includes a parasitic body diode 160 between the source SP and the drain DP, as shown in FIG. 1B.

When current flows from the source SP to the drain DP, a backward bias is applied to the parasitic body diode 160, and thus the parasitic body diode is turned off. Accordingly, it is possible to adjust the amount of current flowing between the drain DP and the source SP depending on the level of voltage applied to a gate GP. On the other hand, when current flows from the drain DP to the source SP, a forward bias is applied to the parasitic body diode, and thus the parasitic body diode 160 is turned on. Accordingly, it is impossible to adjust the amount of current flowing between the drain DP and the source SP simply based on the level of voltage applied to a gate GP. Therefore, the conventional P-channel DMOS FET, like the conventional N-channel DMOS FET, is inappropriate for being used as a bi-directional switching device.

SUMMARY OF THE INVENTION

The present disclosure provides a bi-directional high voltage switching device that conducts current bi-directionally at high voltages and is not adversely affected by parasitic body diodes.

The present disclosure also provides an energy recovery circuit that reduces the amount of energy consumed when charging or discharging a load capacitor, by efficiently driving the bi-directional high voltage switching device.

In accordance with an aspect of the present disclosure, there is provided a bi-directional high voltage switching device comprising an N-channel symmetric double diffused metal oxide semiconductor field effect transistor (DMOS FET) having a drain and a source formed symmetrically to each other, and a P-channel symmetric DMOS FET having a drain and a source formed symmetrically to each other, wherein the N-channel symmetric DMOS FET and the P-channel symmetric DMOS FET are connected to each other in parallel.

In accordance with another aspect of the present disclosure, there is provided an energy recovery circuit comprising a pull-up device, which is connected between a power supply voltage terminal and an output node and transmits a power supply voltage to the output node, a pull-down device, which is connected between a ground voltage terminal and the output node and transmits a ground voltage to the output node, an energy recovery capacitor, which is connected between the output node and the ground voltage terminal, and a bi-directional high voltage switching device, which is connected between the output node and the energy recovery capacitor and comprises an N-channel symmetric double diffused metal oxide semiconductor field effect transistor (DMOS FET) having a drain and a source formed symmetrically to each other and a P-channel symmetric DMOS FET having a drain and a source formed symmetrically to each other, the N-channel and P-channel symmetric DMOS FETs being connected to each other in parallel.

In accordance with a still another aspect of the present disclosure, there is provided an energy recovery circuit comprising a pull-up device, which is connected between a power supply voltage terminal and an output node and transmits a power supply voltage to the output node, a pull-down device, which is connected between a ground voltage terminal and the output node and transmits a ground voltage to the output node, an energy recovery capacitor, which is connected between the output node and the ground voltage terminal, and a bi-directional high voltage switching device, which is connected between the output node and the energy recovery capacitor and comprises an N-channel DMOS FET and a P-channel DMOS FET, the N-channel DMOS FET comprising a first source electrode, a first gate electrode, and a first drain electrode, wherein current flows from the first source electrode to the first drain electrode or from the first drain electrode to the first source electrode depending on the levels of voltages applied to the first source electrode and the first drain electrode, the P-channel DMOS FET comprising a second source electrode, a second gate electrode, and a second drain electrode, wherein a current flows from the second source electrode to the second drain electrode or from the second drain electrode to the second source electrode depending on the levels of voltages applied to the second source electrode and the second drain electrode, and the first source electrode and the second source electrode being connected to each other, and the first drain electrode and the second drain electrode being connected to each other.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF PREFERRED EMBODIMENTS

The present disclosure will now be described more fully with reference to the accompanying drawings, in which preferred embodiments of the disclosure are shown. The present disclosure may, however, be embodied in many different forms and should not be construed as being limited to the embodiments set forth herein. Rather, these embodiments are provided so that this disclosure will be thorough and complete, and will fully convey the scope of various embodiments of the disclosure to those skilled in the art. The scope of the invention is defined only by the appended claims. Like reference numerals may refer to like elements throughout this description and the drawings.

A bi-directional high voltage switching device according to the present disclosure includes an N-channel double diffused metal oxide semiconductor field effect transistor (DMOS FET) and a P-channel DMOS FET, each conducting current bi-directionally, and an energy recovery circuit that reduces the amount of energy consumed when charging or discharging a load capacitor by efficiently driving the bi-directional high voltage switching device.

An energy recovery circuit according to the present disclosure reduces the amount of energy consumed when charging or discharging a load capacitor by efficiently driving the bi-directional high voltage switching device.

Figure 2:
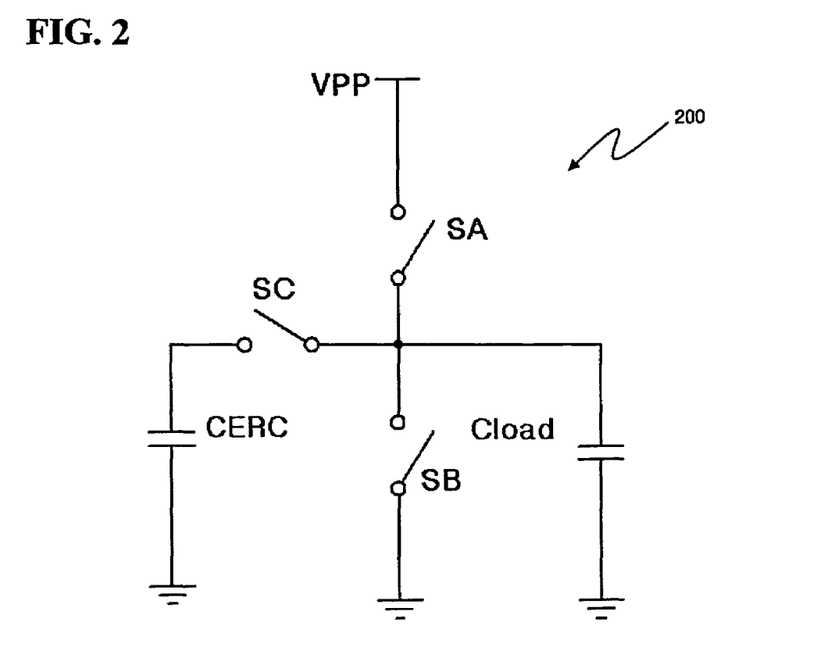
FIG. 2 is an equivalent circuit diagram of a load capacitor charging/discharging circuit of an energy recovery circuit according to an exemplary embodiment of the present disclosure.
Figure 3:
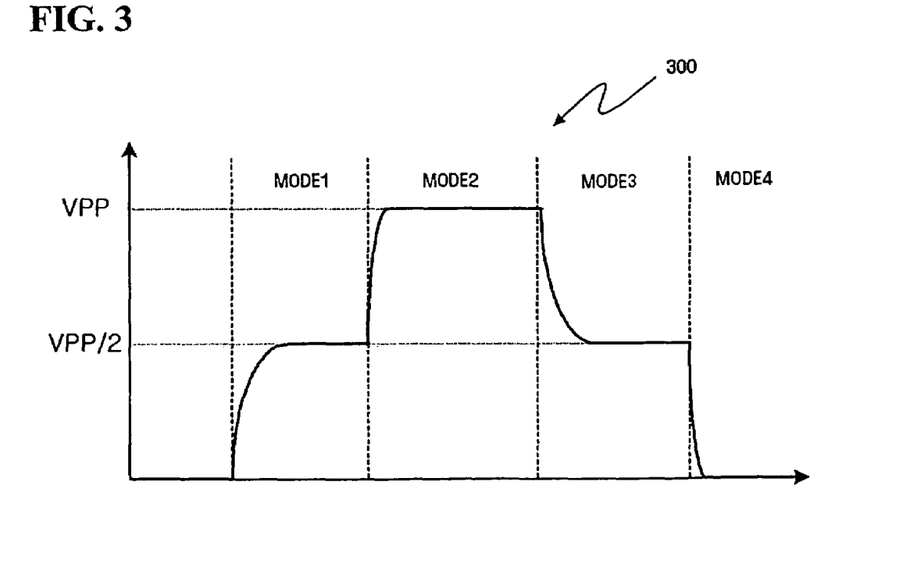
FIG. 3 is a diagram illustrating voltage variations obtained when the load capacitor charging/discharging circuit of FIG. 2 charges or discharges a load capacitor.

The operation of a load capacitor charging/discharging circuit of an energy recovery circuit according to an exemplary embodiment of the present disclosure will now be described with reference to FIGS. 2 and 3. FIG. 2 is an equivalent circuit diagram of a load capacitor charging/discharging circuit of an energy recovery circuit according to an exemplary embodiment of the present disclosure, indicated generally by the reference numeral 200; and FIG. 3 is a diagram illustrating voltage variations obtained when the load capacitor charging/discharging circuit of FIG. 2 charges or discharges a load capacitor, indicated generally by the reference numeral 300.

In mode 1, a first switching device SA and a second switching device SB are turned off, a third switching device SC is turned on, and an energy recovery capacitor CERC is charged with half of a power supply voltage VPP. Accordingly, a load capacitor Cload and the energy recovery capacitor CERC are electrically connected to each other, and the voltage with which the energy recovery capacitor CERC is charged is transmitted to the load capacitor Cload via the third switching device SC. The third switching device SC is turned on until the load capacitor Cload is charged with half of the power supply voltage VPP.

In mode 2, the second and third switching devices SB and SC are turned off, and the first switching device SA is turned on such that the load capacitor Cload is connected to a power supply voltage terminal. Accordingly, the power supply voltage VPP is transmitted to the load capacitor Cload via the first switching device SA. The first switching device SA is turned on until the load capacitor Cload is charged with the power supply voltage VPP.

In mode 3, the first and second switching devices SA and SB are turned off, and the third switching device SC is turned on such that the load capacitor Cload is connected to the energy recovery capacitor CERC. Accordingly, the power supply voltage VPP, with which the load capacitor Cload is charged, is transmitted to the energy recovery capacitor CERC via the third switching device SC. The third switching device SC is turned on until the load capacitor Cload is discharged to the extent that its voltage level drops to half of the power supply voltage VPP.

In mode 4, the first and third switching devices SA and SC are turned off, and the second switching device SB is turned on such that the load capacitor Cload and a ground voltage terminal are connected to each other. Accordingly, the remaining half of the power supply voltage VPP, with which the load capacitor Cload is charged, is transmitted to the ground voltage terminal. The second switching device SB is turned on until the load capacitor Cload is discharged to the extent that its voltage level drops to a ground voltage GND.

The first switching device SA only has to transmit voltage from the power supply voltage terminal to the load capacitor Cload. Therefore, the first switching device SA may conduct current in only one direction. The second switching device SB only has to transmit voltage from the load capacitor Cload to the ground voltage terminal. Accordingly, the second switching device SB may conduct current in only one direction. The third switching device SC, however, has to transmit voltage from the energy recovery capacitor CERC to the load capacitor Cload and from the load capacitor Cload to the energy recovery capacitor CERC. Accordingly, the third switching device SC, unlike the first and second switching devices SA and SB, has to conduct current bi-directionally.

Figure 4A:
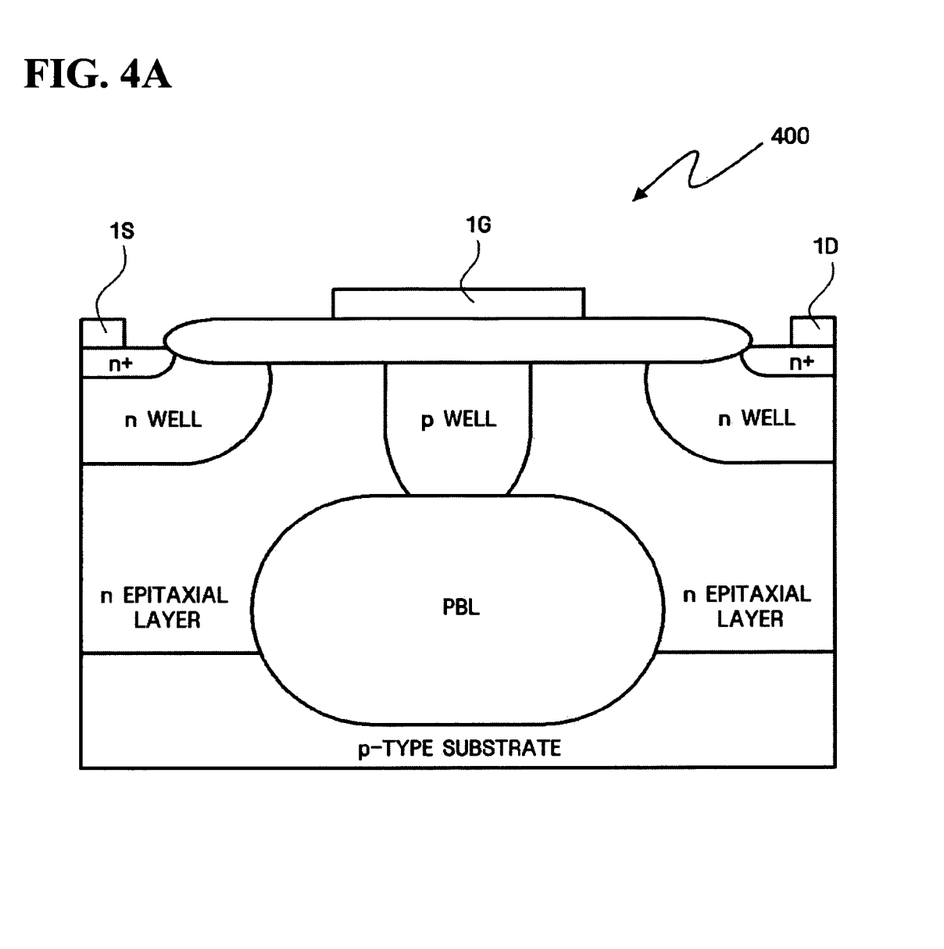
FIGS. 4A and 4B are cross-sectional views of an N-channel symmetric DMOS FET and a P-channel symmetric DMOS FET, respectively.
Figure 4B:
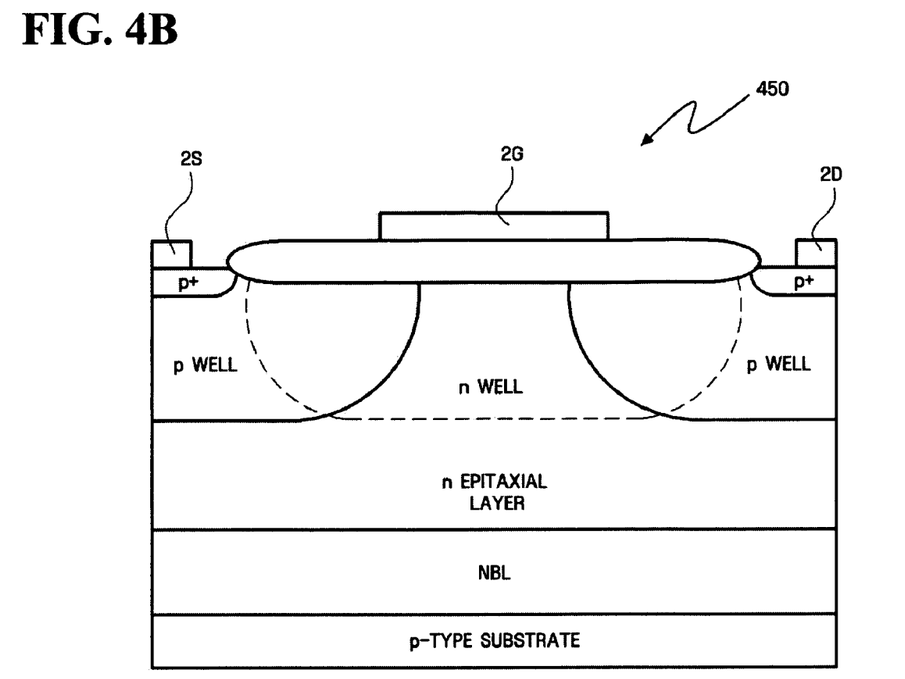
Figure 5A:
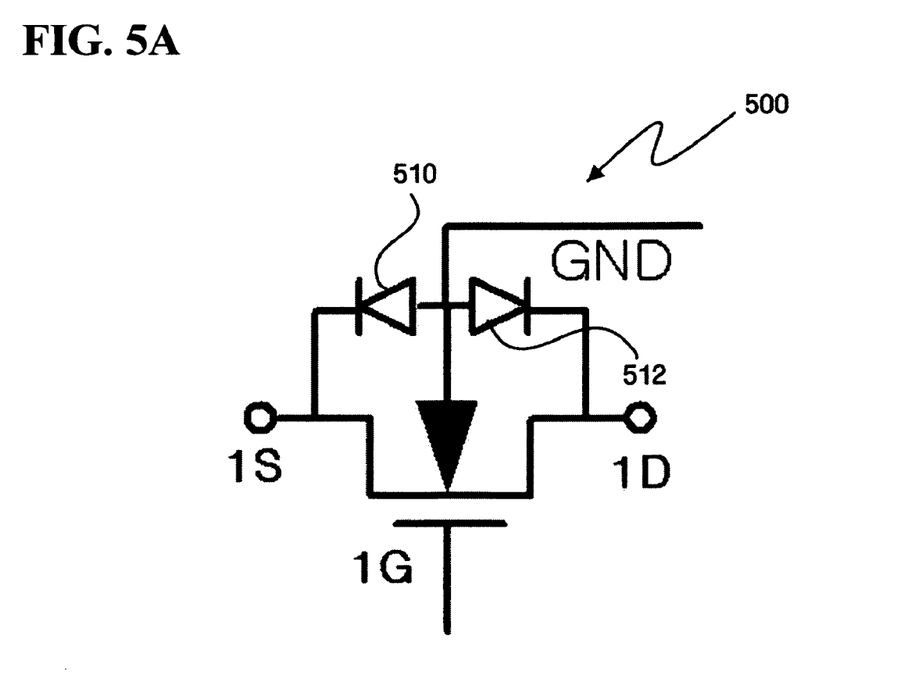
FIG. 5A is an equivalent circuit diagram of the N-channel symmetric DMOS FET of FIG. 4A.
Figure 5B:
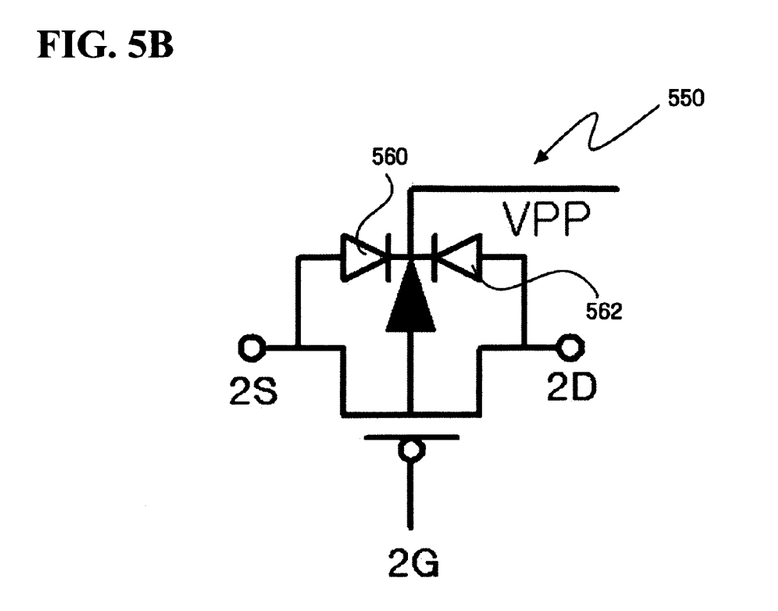
FIG. 5B is an equivalent circuit diagram of the P-channel symmetric DMOS FET of FIG. 4B.
Figure 6A:
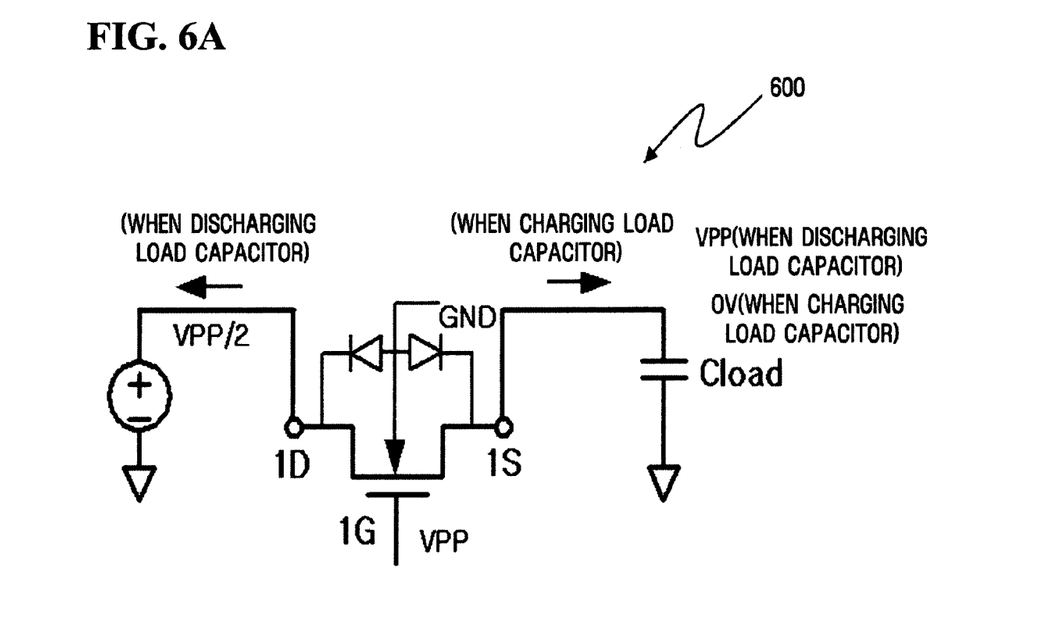
FIG. 6A is an equivalent circuit diagram illustrating current flow paths when the N-channel symmetric DMOS FET of FIG. 4A charges and discharges a load capacitor.
Figure 6B:
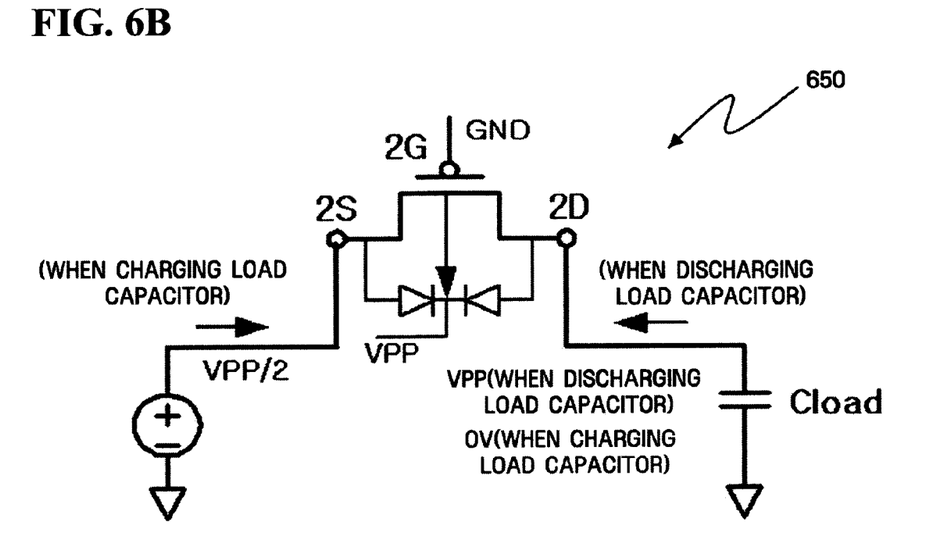
FIG. 6B is an equivalent circuit diagram illustrating current flow paths when the P-channel symmetric DMOS FET of FIG. 4B charges and discharges a load capacitor.

The third switching device SC, which is a bi-directional switching device, may be a symmetric double diffused metal oxide semiconductor field effect transistor (DMOS FET) illustrated in any of FIGS. 4A through 6B. FIGS. 4A and 4B are cross-sectional views of an N-channel symmetric DMOS FET, indicated generally by the reference numeral 400; and a P-channel symmetric DMOS FET, indicated generally by the reference numeral 450, respectively, FIGS. 5A and 5B are equivalent circuit diagrams of the N-channel symmetric DMOS FET and the P-channel symmetric DMOS FET shown in FIG. 4A and FIG. 4B, respectively, where the equivalent circuit diagram of the N-channel symmetric DMOS FET is indicated generally by the reference numeral 500, and the equivalent circuit diagram of the P-channel symmetric DMOS FET is indicated generally by the reference numeral 550. FIG. 6A is a circuit diagram illustrating current flow paths when the N-channel symmetric DMOS FET of FIG. 4A charges and discharges a load capacitor, as indicated generally by the reference numeral 600, and FIG. 6B is a circuit diagram illustrating current flow paths when the P-channel symmetric DMOS FET of FIG. 4B charges and discharges a load capacitor, as indicated generally by the reference numeral 650.

The symmetric DMOS FET includes an N-channel symmetric DMOS FET and a P-channel symmetric DMOS FET. The symmetric DMOS FET is also disclosed in Korean Patent Application No. 2003-0040182, which is assigned to the applicant of the present invention.

When applying a ground voltage GND to a semiconductor substrate of the N-channel symmetric DMOS FET 400 illustrated in FIG. 4A, the N-channel symmetric DMOS FET has two parasitic body diodes 510 and 512 in its equivalent circuit, as shown in FIG. 5A. Accordingly, in the case of conducting current from a drain electrode 1D to a source electrode 1S or vice versa, the two parasitic body diodes 510 and 512 are not turned on, and thus, it is possible to conduct current bi-directionally between the drain electrode 1D and the source electrode 1S.

When applying a power supply voltage VPP to a semiconductor substrate of a P-channel symmetric DMOS FET 450 illustrated in FIG. 4B, the P-channel symmetric DMOS FET has two parasitic body diodes 560 and 562 in its equivalent circuit, as shown in FIG. 5B. Accordingly, in the case of conducting current from a drain electrode 2D to a source electrode 2S or vice versa, the two parasitic body diodes 560 and 562 are not turned on, and thus, it is possible to conduct current bi-directionally between the source electrode 2S and the drain electrode 2D.

However, in a case where a switching device only consists of an N-channel or a P-channel symmetric DMOS FET, its current driving capability deteriorates, and thus the size of the N-channel or P-channel symmetric DMOS FET should increase to compensate for lack of current driving capability, which will be described more fully with reference to FIGS. 6A and 6B.

Referring to FIGS. 6A and 6B, an energy recovery capacitor CERC is equivalent to an independent voltage source, which accounts for half of a power supply voltage VPP. More specifically, in the energy recovery capacitor CERC illustrated in FIG. 6A, the power supply voltage VPP is applied to a gate electrode 1G, and a ground voltage GND is applied to a semiconductor substrate. In the case of transferring voltage from the energy recovery capacitor CERC to a load capacitor Cload with an N-channel symmetric DMOS FET turned on, i.e., in the case of charging the load capacitor Cload, there is not much difference between a voltage level of a source electrode 1S and a voltage level of the semiconductor substrate at an early stage of the charging of the load capacitor Cload, more specifically, until the load capacitor Cload is completely charged. However, once the load capacitor Cload is completely charged, the voltage difference between the voltage levels of the source electrode 1S and the semiconductor substrate is half of the power supply voltage VPP. On the other hand, in the case of transferring voltage from the load capacitor Cload to the energy recovery capacitor CERC with the N-channel symmetric DMOS FET turned on, i.e., in the case of discharging the load capacitor Cload, the voltage difference between voltage levels of a drain electrode 1D and the semiconductor substrate is maintained at half of the power supply voltage VPP. Accordingly, due to a body effect, a threshold voltage of the N-channel symmetric DMOS FET is higher when discharging the load capacitor Cload than when charging the load capacitor Cload, which deteriorates the current driving capability of the N-channel symmetric DMOS FET. In order to prevent the current driving capability of the N-channel symmetric DMOS FET from deteriorating, the size of the N-channel symmetric DMOS FET should increase if it is to be used for discharging.

In the energy recovery capacitor CERC illustrated in FIG. 6B, a ground voltage GND is applied to a gate electrode 2G, and a power supply voltage VPP is applied to a semiconductor substrate. In the case of transferring voltage from the energy recovery capacitor CERC to a load capacitor Cload with a P-channel symmetric DMOS FET turned on, i.e., in the case of the load capacitor Cload, the voltage difference between voltage levels of a drain electrode 2D and the semiconductor substrate is maintained at half of the power supply voltage VPP. On the other hand, in the case of transferring voltage from the load capacitor Cload to the energy recovery capacitor CERC with the P-channel symmetric DMOS FET turned on, i.e., in the case of discharging the load capacitor Cload, there is not much difference between a voltage level of a source electrode 2S and a voltage level of the semiconductor substrate at an early stage of the discharging of the load capacitor Cload, more specifically, until the load capacitor Cload is completely discharged. However, once the load capacitor Cload is completely charged, the voltage difference between the voltage levels of the source electrode 2S and the semiconductor substrate is half of the power supply voltage VPP. Accordingly, due to the body effect, a threshold voltage of the P-channel symmetric DMOS FET is higher when charging the load capacitor Cload than when discharging the load capacitor Cload, which deteriorates the current driving capability of the P-channel symmetric DMOS FET. In order to prevent the current driving capability of the P-channel symmetric DMOS FET from deteriorating, the size of the P-channel symmetric DMOS FET should increase if it is to be used for charging. In short, a bi-directional high voltage switching device according to an exemplary embodiment of the present disclosure uses an N-channel symmetric DMOS FET in a charging process and uses a P-channel symmetric DMOS FET in a discharging process such that the driving capabilities do not deteriorate and the sizes need not be increased.

Figure 7A:
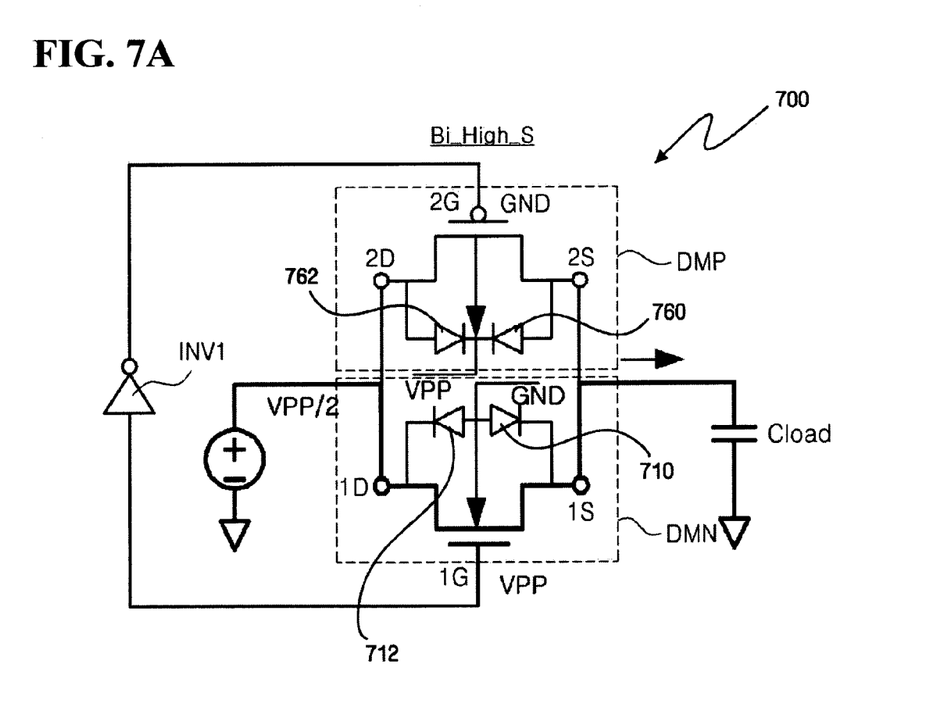
FIGS. 7A and 7B are equivalent circuit diagrams each illustrating current flow paths in a bi-directional high voltage switching device according to an exemplary embodiment of the present disclosure when charging and discharging a load capacitor, respectively.
Figure 7B:
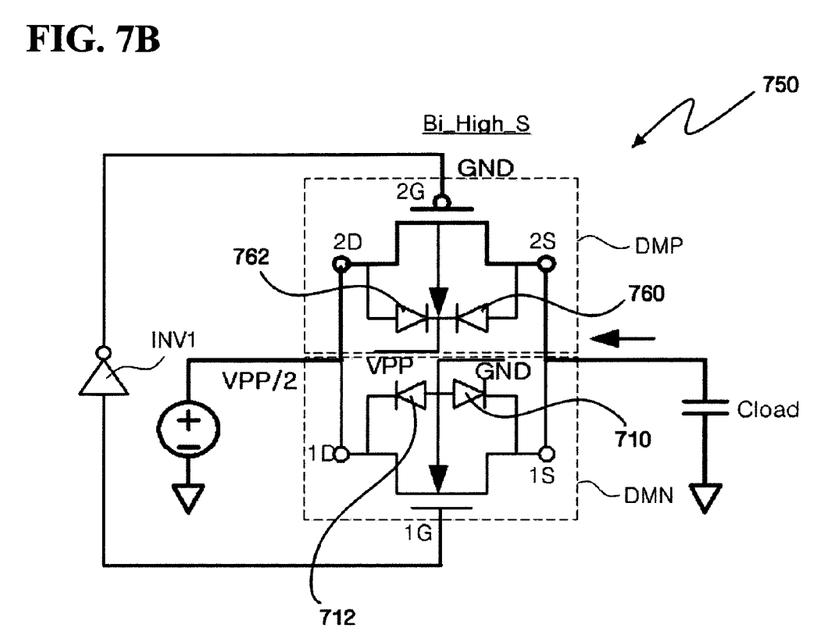

A bi-directional high voltage switching device Bi_High_S according to an exemplary embodiment of the present disclosure will now be described more fully with reference to FIGS. 7A and 7B. FIGS. 7A and 7B are circuit diagrams each illustrating current flow paths in a bi-directional high voltage switching device according to an exemplary embodiment of the present disclosure when charging and discharging a load capacitor, as indicated generally by the reference numerals 700 and 750, respectively.

The bi-directional high voltage switching device Bi_High_S includes an N-channel symmetric DMOS FET (DMN) and a P-channel symmetric DMOS FET (DMP). The N-channel symmetric DMOS FET (DMN) includes a first source electrode 1S, a first gate electrode 1G, and a first drain electrode 1D. Since two parasitic diodes 710 and 712 are not simultaneously turned on, the N-channel symmetric DMOS FET (DMN) can conduct current either from the first source electrode 1S to the first drain electrode 1D or from the first drain electrode 1D to the first source electrode 1S depending on the voltage levels of the first source and drain electrodes 1S and 1D, when voltage is applied to the first gate electrode 1G such that the first source electrode 1S and the first drain electrode 1D are connected to each other.

The P-channel symmetric DMOS FET (DMP) includes a second source electrode 2S, a second gate electrode 2G, and a second drain electrode 2D. Since two parasitic diodes 760 and 762 are not simultaneously turned on, the P-channel symmetric DMOS FET (DMP) can conduct current either from the second source electrode 2S to the second drain electrode 2D or from the second drain electrode 2D to the second source electrode 2S depending on the voltage levels of the second source and drain electrodes 2S and 2D, when voltage is applied to the second gate electrode 2G such that the second source electrode 2S and the second drain electrode 2D are connected to each other.

The N-channel symmetric DMOS FET (DMN) and the P-channel symmetric DMOS FET (DMP) are connected to each other in parallel. In other words, the first source electrode 1S of the N-channel symmetric DMOS FET (DMN) is connected to the second source electrode 2S of the P-channel symmetric DMOS FET (DMP), and the first drain electrode 1D of the N-channel symmetric DMOS FET (DMN) is connected to the second drain electrode 2D of the P-channel symmetric DMOS FET (DMP).

A process of charging a load capacitor Cload using the bi-directional high voltage switching device Bi_High_S will now be described in greater detail with reference to FIG. 7A. Referring to FIG. 7A, an energy recovery capacitor CERC is illustrated with an equivalent independent voltage source that accounts for half of a power supply voltage VPP. The power supply voltage is applied to the first gate electrode 1G, and a ground voltage GND is applied to a semiconductor substrate. In the case of transferring voltage from the energy recovery capacitor CERC to the load capacitor Cload with the N-channel symmetric DMOS FET (DMN) turned on, i.e., in the case of charging the load capacitor Cload, there is not much difference between a voltage level of the first source electrode 1S and a voltage level of the semiconductor substrate at an early stage of the charging of the load capacitor Cload, more specifically, until the load capacitor Cload is completely charged. However, once the load capacitor Cload is completely charged, the voltage difference between the voltage levels of the first source electrode 1S and the semiconductor substrate is half of the power supply voltage VPP. Therefore, in the present embodiment, it is possible to prevent the current driving capability of the N-channel symmetric DMOS FET (DMN) from deteriorating by using the N-channel symmetric DMOS FET (DMN) to charge the load capacitor Cload.

In the case of discharging the load capacitor Cload using the bi-directional high voltage switching device Bi_High_S, as shown in FIG. 7B, the current driving capability of the P-channel symmetric DMOS FET (DMP) can be prevented from deteriorating because in the present embodiment, the N-channel symmetric DMOS FET (DMN) is used to charge the load capacitor Cload, and the P-channel symmetric DMOS FET (DMP) is used to discharge the load capacitor Cload. Accordingly, it is possible to minimize the deterioration of the current driving capability of the bi-directional high voltage switching device Bi_High_S when charging or discharging the load capacitor Cload without increasing the size of each of the N-channel and P-channel symmetric DMOS FETs (DMN and DMP).

Here, the voltage applied to the first gate electrode 1G of the N-channel symmetric DMOS FET (DMN) is complementary to the voltage applied to the second gate electrode 2G of the P-channel symmetric DMOS FET (DMP). By connecting an inverter INV1 between the first and second gate electrodes 1G and 2G, as illustrated in FIGS. 7A and 7B, it is possible to easily apply voltages that are complementary to each other to the first and second electrodes 1G and 2G. By applying the complementary voltages to the first and second electrodes 1G and 2G, it is possible to activate both the N-channel and P-channel symmetric DMOS FETs with a single control signal so as to charge or discharge the load capacitor Cload.

The bi-directional high voltage switching device Bi_High_S of FIG. 7A or 7B can be effectively applied to an energy recovery circuit for an integrated circuit device, such as a driver integrated circuit of a plasma display device, which requires high-voltage operations.

Figure 8:
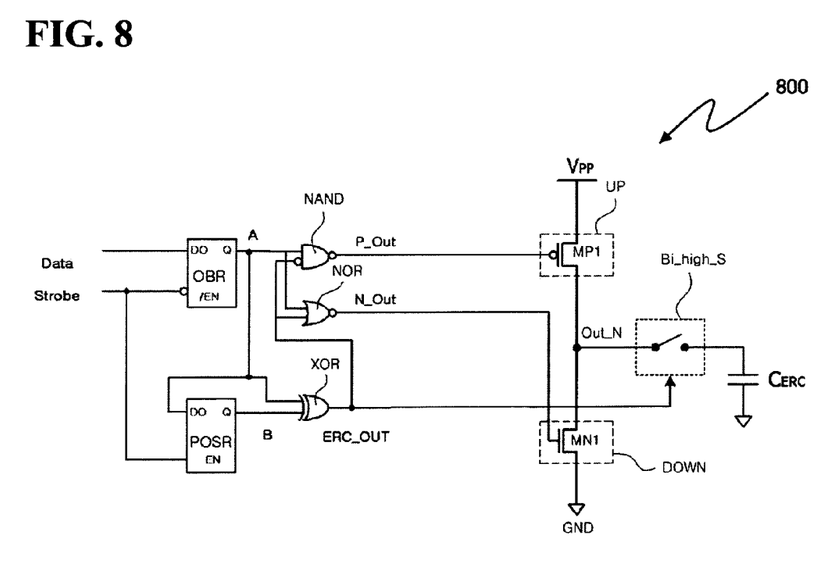
FIG. 8 is an equivalent circuit diagram of an energy recovery circuit according to an exemplary embodiment of the present disclosure.
Figure 9:
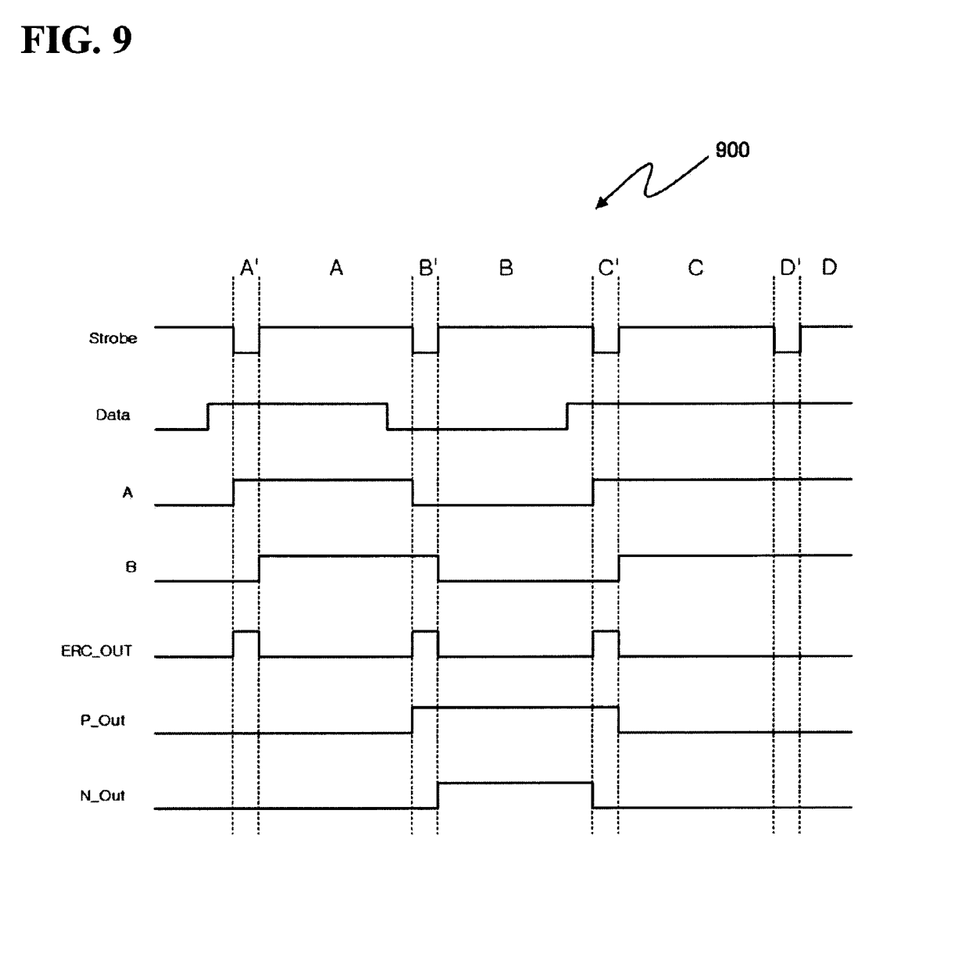
FIG. 9 is a timing diagram of the energy recovery circuit of FIG. 8 according to the exemplary embodiment of the present disclosure.

The operation of an energy recovery circuit according to an exemplary embodiment of the present disclosure will now be described more fully with reference to FIGS. 8 and 9. FIG. 8 is a circuit diagram of the energy recovery circuit according to the exemplary embodiment of the present disclosure, indicated generally by the reference numeral 800; and FIG. 9 is a timing diagram of the energy recovery circuit according to the exemplary embodiment of the present disclosure, indicated generally by the reference numeral 900. The energy recovery circuit 800 includes a pull-up device UP, a pull-down device DOWN, an energy recovery capacitor CERC, and a bi-directional high voltage switching device Bi_High_S.

The pull-up device UP, which is connected between a power supply voltage terminal and an output node OUT_N, transmits a power supply voltage VPP to the output node OUT_N. The pull-down device DOWN, which is connected between a ground voltage terminal and the output node OUT_N, transmits a ground voltage GND to the output node OUT_N. The energy recovery capacitor CERC is connected between the output node OUT_N and the ground voltage terminal, and the bi-directional high voltage switching device Bi_High_S is connected between the output node OUT_N and the energy recovery circuit CERC. The bi-directional high voltage switching device Bi_High_S transmits the voltage with which the energy recovery capacitor CERC is charged to the output node OUT_N or transmits the voltage at the output node OUT_N to the energy recovery capacitor CERC.

Preferably, but not necessarily, the bi-directional high voltage switching device Bi_High_S is activated only when the voltage of the output node OUT_N varies from the ground voltage GND to the power supply voltage VPP or vice versa, because there is no need for the bi-directional high voltage switching device Bi_High_S to transmit the voltage at the output node OUT_N to the energy recovery capacitor CERC or vice versa when the voltage of the output node OUT_N does not change. Accordingly, it is possible to reduce the power consumption of the bi-directional high voltage switching device Bi_High_S by activating the bi-directional high voltage switching device only when it is necessary.

The amount of time that the bi-directional high voltage switching device Bi_High_S is activated may be adjusted by adjusting the amount of time that a strobe signal Strobe is activated or inactivated. The strobe signal Strobe is a control signal that synchronizes D-flipflops OBR and POSR with each other. In short, the amount of time that the output node OUT_N and the energy recovery capacitor CERC are connected to each other can be easily controlled by adjusting the amount of time that the bi-directional high voltage switching device Bi_High_S is activated, and the duration of activation of the bi-directional high voltage switching device Bi_High_S can be adjusted by adjusting the amount of time that the strobe signal Strobe is activated or inactivated.

The energy recovery circuit according to the exemplary embodiment of the present disclosure applies a signal XOR obtained by performing an exclusive OR logic operation on a first D-flipflop signal A and a second D-flipflop signal B to the bi-directional high voltage switching device Bi_High_S directly or via a level shifter (not shown) or a semiconductor circuit, such as a transmission gate TRANS. Here, the first D-flipflop signal A is a signal that is activated by an inverse signal of the strobe signal Strobe and is provided in response to receipt of a data signal Data, and the second D-flipflop signal B is a signal that is activated by the strobe signal Strobe and is provided in response to receipt of the first D-flipflop signal A. Accordingly, the bi-directional high voltage switching device Bi_High_S can be activated only when the voltage of the output node OUT_N varies from the ground voltage GND to the power supply voltage VPP or from the power supply voltage VPP to the ground voltage GND. In addition, the bi-directional high voltage switching device Bi_High_S is activated only when the strobe signal Strobe is logic low.

When an activation signal ERC_OUT is logic low, the bi-directional high voltage switching device Bi_High_S is inactivated. On the other hand, when the activation signal ERC_OUT is logic high, the bi-directional high voltage switching device Bi_High_S is activated.

The first D-flipflop signal A is a signal output from the D-flipflop OBR as a result of inputting the data signal Data to the D-flipflop OBR after activating the D-flipflop OBR by applying the inverse signal of the strobe signal Strobe to the D-flipflop OBR. Accordingly, the first D-flipflop signal A indicates a current state of the data signal Data.

The second D-flipflop signal B is a signal output from the D-flipflop POSR as a result of inputting the first D-flipflop signal A to the D-flipflop POSR after activating the D-flipflop by applying the strobe signal Strobe to the D-flipflop POSR. Accordingly, the second D-flip-flop signal B indicates a previous state of the data signal Data.

The amount of time A', B', C' or D' that the strobe signal Strobe is logic low can be adjusted by using the element XOR, which performs an exclusive OR logic operation on the first and second D-flipflop signals A and B as an activation signal ERC_OUT to the bi-directional high voltage switching device Bi_High_S, as shown in FIG. 8. In accordance with FIG. 9, the amount of time that the activation signal ERC_OUT is logic high can be adjusted by adjusting the amount of time A', B', C' or D' that the strobe signal Strobe is logic low. In addition, by using the signal ERC_OUT to activate the bi-directional high voltage switching device Bi_High_S, it is possible to activate the bi-directional high voltage switching device Bi_High_S only when the current state of the data signal Data is different from the previous state of the data signal Data. Accordingly, it is possible to reduce the power consumption of the bi-directional high voltage switching device Bi_High_S by preventing the bi-directional high voltage switching device Bi_High_S from being unnecessarily activated.

Preferably, the pull-up device UP is a PMOS transistor MP1, in which case, the pull-up device UP can efficiently transmit the power supply voltage VPP to the output node OUT_N. The pull-up device UP is activated by an activation signal P_Out, which is obtained by performing a NAND operation on the first D-flipflop signal A and the inversed signal of the activation signal ERC_OUT. When the activation signal P_Out is logic low, the pull-up device UP is activated. On the other hand, when the activation signal P_Out is logic high, the pull-up device UP is inactivated.

Preferably, the pull-down device DOWN is an NMOS transistor MN1, in which case, the pull-down device DOWN can efficiently transmit the ground voltage GND to the output node OUT_N. The pull-down device DOWN is activated by an activation signal N_Out, which is obtained by performing a NOR operation on the first D-flipflop signal A and the activation signal ERC_OUT. When the activation signal N_Out is logic high, the pull-down device DOWN is activated. On the other hand, when the activation signal N_Out is logic low, the pull-down device DOWN is inactivated.

Preferably, the activation signal ERC_OUT for the bi-directional high voltage switching device Bi_High_S is activated during a section B' ranging from the moment when the state of the activation signal P_Out for the pull-up device UP is shifted from a logic low state to a logic high state to the moment when the state of the activation signal N_Out for the pull-down device DOWN is shifted from a logic low state to a logic high state and during a section C' ranging from the moment when the state of the activation signal P_Out for the pull-up device UP is shifted from the logic high state to the logic low state to the moment when the state of the activation signal N_Out for the pull-down device DOWN is shifted from the logic high state to the logic low state. Accordingly, it is possible to prevent the pull-up device UP and the pull-down device DOWN from being connected to the energy recovery capacitor CERC and eventually prevent the bi-directional high voltage switching device Bi_High_S from unnecessarily consuming energy.

Energy recovery circuit, according to the present disclosure, is possible to reduce the power consumption of the bi-directional high voltage switching device Bi_High_S by preventing the bi-directional high voltage switching device Bi_High_S from being unnecessarily activated.

Although only a few embodiments of the present disclosure have been shown and described with reference to the attached drawings, it will be understood by those skilled in the art that changes may be made to these elements without departing from the features and spirit of the disclosure. Therefore, it is to be understood that the above-described embodiments have been provided only in a descriptive sense.

As described above, according to the present disclosure, it is possible for an energy recovery circuit to reduce the amount of energy consumed when charging or discharging a load capacitor by efficiently driving a bi-directional high voltage switching device, which includes an N-channel DMOS FET and a P-channel DMOS FET each flowing current bi-directionally.

What is claimed is:

1. An energy recovery circuit comprising:
   a pull-up device, which is connected between a power supply voltage terminal and an output node and transmits a power supply voltage to the output node;
   a pull-down device, which is connected between a ground voltage terminal and the output node and transmits a ground voltage to the output node;
   an energy recovery capacitor, which is connected between the output node and the ground voltage terminal;
   a load capacitor, which is connected to the output node; and
   a bidirectional high voltage switching device, which is connected between the output node and the energy recovery capacitor, wherein the bidirectional high voltage switching device comprises an N-channel symmetric double diffused metal oxide semiconductor field effect transistor (DMOS FET) having a drain and a source formed symmetrically to each other and transferring voltages from the energy recovery capacitor to the load capacitor, and a P-channel symmetric DMOS FET having a drain and a source formed symmetrically to each other for and transferring voltages from the load capacitor to the energy capacitor, the N-channel and P-channel symmetric DMOS FETs are connected to each other in parallel.

2. The energy recovery circuit of claim 1, wherein an amount of time that the bidirectional high voltage switching device is activated is adjusted by adjusting an amount of time that a strobe signal is logic high or logic low.

3. The energy recovery circuit as defined in claim 1, wherein the N-channel DMOS FET comprises a first source electrode, a first gate electrode, and a first drain electrode, wherein current flows from the first source electrode to the first drain electrode or from the first drain electrode to the first source electrode depending on the levels of voltages applied to the first source electrode and the first drain electrode;
   the P-channel DMOS FET comprises a second source electrode, a second gate electrode, and a second drain electrode, where a current flows from the second source electrode to the second drain electrode or from the second drain electrode to the second source electrode depending on the levels of voltages applied to the second source electrode and the second drain electrode, and the first source electrode and the second source electrode being connected to each other, and the first drain electrode and the second drain electrode being connected to each other.

4. The energy recovery circuit of claim 1, wherein the bidirectional high voltage switching device is activated when a voltage of the output node varies from a ground voltage level to a power supply voltage level or from the power supply voltage level to the ground voltage level.

5. The energy recovery circuit of claim 3, wherein the bidirectional high voltage switching device is activated when a voltage of the output node varies from a ground voltage level to a power supply voltage level or from the power supply voltage level to the ground voltage level.

6. The energy recovery circuit of claim 4, wherein an amount of time that the bidirectional high voltage switching device is activated is adjusted by adjusting an amount of time that a strobe signal is logic high or logic low.

7. The energy recovery circuit of claim 6, wherein the bidirectional high voltage switching device is activated by an exclusive OR logic signal obtained by performing an exclusive OR logic operation on a first D-flipflop signal and a second D-flipflop signal, the first D-flipflop signal is provided in response to receipt of a data signal and activated by an inversed signal of the strobe signal, and the second D-flipflop signal is obtained in response to receipt of the first D-flipflop signal and activated by the strobe signal.

8. The energy recovery circuit of claim 7, wherein the pull-up device is a P-channel MOS transistor.

9. The energy recovery circuit of claim 8, wherein the pull-up device is activated by a NAND signal obtained by performing a NAND operation on the first D-flipflop signal and an inversed signal of the exclusive OR logic signal.

10. The energy recovery circuit of claim 7, wherein the pull-down device is an N-channel MOS transistor.

11. The energy recovery circuit of claim 10, wherein the pull-down device is controlled by a NOR signal obtained by performing a NOR operation on the first D-flipflop signal and the exclusive OR logic signal.

12. The energy recovery circuit of claim 3, wherein a voltage applied to the first gate electrode is complementary to a voltage applied to the second gate electrode.

* * * * *